(12) United States Patent
Park et al.

(10) Patent No.: US 11,716,889 B2
(45) Date of Patent: Aug. 1, 2023

(54) ORGANIC LIGHT EMITTING DIODE DISPLAY DEVICE WITH NON-STRAIGHT VERTICAL BANKS

(71) Applicant: LG Display Co., Ltd., Seoul (KR)

(72) Inventors: Sungjin Park, Paju-si (KR); Hyuk-Chan Gee, Gumi-si (KR); HuiKun Yun, Gimpo-si (KR); YunJoo Cho, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 281 days.

(21) Appl. No.: 17/136,837

(22) Filed: Dec. 29, 2020

(65) Prior Publication Data

US 2021/0202609 A1    Jul. 1, 2021

(30) Foreign Application Priority Data

Dec. 31, 2019   (KR) .................. 10-2019-0179918

(51) Int. Cl.
  *H01L 27/32*    (2006.01)
  *H10K 59/35*    (2023.01)
  *H10K 59/122*   (2023.01)

(52) U.S. Cl.
  CPC ......... *H10K 59/353* (2023.02); *H10K 59/122* (2023.02); *H10K 59/352* (2023.02)

(58) Field of Classification Search
  CPC ............. H01L 27/3218; H01L 27/3216; H01L 27/3246
  See application file for complete search history.

(56) References Cited

U.S. PATENT DOCUMENTS

| | | | |
|---|---|---|---|
| 2008/0036374 A1* | 2/2008 | Okano | H10K 71/135 313/506 |
| 2016/0247863 A1* | 8/2016 | Choung | H10K 50/822 |
| 2017/0069697 A1* | 3/2017 | Hashimoto | H01L 27/3246 |
| 2021/0043706 A1* | 2/2021 | Kobayashi | H01L 51/56 |
| 2021/0167147 A1* | 6/2021 | Nakatani | H01L 27/3248 |
| 2021/0288120 A1* | 9/2021 | Zhao | H10K 59/122 |

FOREIGN PATENT DOCUMENTS

WO    WO-2022204918 A1 * 10/2022

* cited by examiner

*Primary Examiner* — Peter Bradford
(74) *Attorney, Agent, or Firm* — Fenwick & West LLP

(57) ABSTRACT

The present disclosure relates to an organic light emitting display device. According to an aspect of the present disclosure, an organic light emitting display device includes a plurality of sub-pixels including a first sub-pixel, a second sub-pixel and a third sub-pixel, a first electrode, a horizontal bank including a first horizontal bank and a second horizontal bank that are alternately arranged in a first direction to cover edges of the first electrodes, a vertical bank including a first vertical bank, a second vertical bank, and a third vertical bank that are alternately arranged in a second direction to cover edges of the first electrode and disposed on the horizontal bank, an organic light emitting layer and a second electrode. Wherein an area wider than the first sub-pixel is formed on the first horizontal bank or the second horizontal bank adjacent to the first sub-pixel, and ink is injected on the area, whereby color mixing of the ink can be minimized. And, a high-resolution organic light emitting display device can be implemented, simultaneously with improving display quality of the organic light emitting display device.

19 Claims, 9 Drawing Sheets

ORGANIC LIGHT EMITTING DIODE DISPLAY DEVICE WITH NON-STRAIGHT VERTICAL BANKS

CROSS-REFERENCE TO RELATED APPLICATIONS

This application claims the priority benefit of Republic of Korea Patent Application No. 10-2019-0179918 filed on Dec. 31, 2019 with the Korean Intellectual Property Office, the disclosure of which is incorporated herein by reference.

BACKGROUND

Technical Field

The present disclosure relates to an organic light emitting display device, and more particularly, to an organic light emitting display device having improved display quality by reducing color mixing of ink and a thickness variation in an organic light emitting layer when the organic light emitting layer is formed through a solution process.

Description of the Related Art

An organic light emitting display device (OLED) may be manufactured to be light and thin and allow for a simple manufacturing process, by including an organic light emitting element which is a self-light emitting element, unlike a liquid crystal display device (LCD) having a backlight. In addition, the organic light emitting display device has advantages in terms of a low voltage driving and a fast response speed. The organic light emitting display device has a structure in which an organic light emitting layer is formed between an anode and a cathode. When a voltage is applied to the organic light emitting element, holes injected from the anode and electrons injected from the cathode form excitons in the organic light emitting layer. The organic light emitting display device displays an image using light emitted while the excitons formed above transition from an unstable excitation state to a stable ground state.

The organic light emitting layer is mainly formed through a deposition method using a mask. In this case, there were difficulties in implementing a large area and high-resolution display device due to sagging of the mask, manufacturing variations, and shadow effects. Accordingly, a method of forming an organic light emitting layer by a solution process of dropping ink in a light emitting area has been proposed. In the solution process, an organic light emitting layer is formed by forming a bank defining a light emitting area and a non-light emitting area on an anode, and then, injecting ink on the light emitting area using an injection device while scanning the device to thereby hardening the ink.

SUMMARY

An object to be achieved by the present disclosure is to provide an organic light emitting display device capable of solving an ink mixing problem that occurs when an organic light emitting layer is formed through a solution process.

Another object to be achieved by the present disclosure is to provide an organic light emitting display device having improved display quality by minimizing a thickness variation in an organic light emitting layer.

Objects of the present disclosure are not limited to the above-mentioned objects, and other objects, which are not mentioned above, can be clearly understood by those skilled in the art from the following descriptions.

According to an aspect of the present disclosure, an organic light emitting display device includes a plurality of sub-pixels including a first sub-pixel, a second sub-pixel, and a third sub-pixel, a first electrode disposed on each of the plurality of sub-pixels, a horizontal bank including a first horizontal bank and a second horizontal bank that are alternately arranged in a first direction to cover edges of the first electrodes, a vertical bank including a first vertical bank, a second vertical bank, and a third vertical bank that are alternately arranged in a second direction to cover edges of the first electrode and disposed on the horizontal bank, an organic light emitting layer disposed on the first electrode, and a second electrode disposed on the organic light emitting layer, wherein the first sub-pixel is surrounded by the first horizontal bank, the second horizontal bank, the first vertical bank, and the second vertical bank, wherein the second sub-pixel is surrounded by the first horizontal bank, the second horizontal bank, the second vertical bank, and the third vertical bank, wherein the third sub-pixel is surrounded by the first horizontal bank, the second horizontal bank, the third vertical bank, and the first vertical bank, wherein a distance between the first vertical bank and the second vertical bank disposed on the first horizontal bank or the second horizontal bank adjacent to the first sub-pixel is greater than a distance between the first vertical bank and the second vertical bank surrounding the first sub-pixel.

That is, an area wider than the first sub-pixel is formed on the first horizontal bank or the second horizontal bank adjacent to the first sub-pixel, and ink is injected on the area, whereby color mixing of the ink can be minimized. And, a high-resolution organic light emitting display device can be implemented, simultaneously with improving display quality of the organic light emitting display device.

Other detailed matters of the exemplary embodiments are included in the detailed description and the drawings.

According to the present disclosure, ink color mixing can be reduced and thickness variations according to positions can be reduced, thereby improving display quality.

According to the present disclosure, a thickness of an organic light emitting layer can be reduced, and thickness variations according to positions thereof can be reduced.

According to the present disclosure, a high-resolution organic light emitting display device can be implemented without a complicated design and equipment changes.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
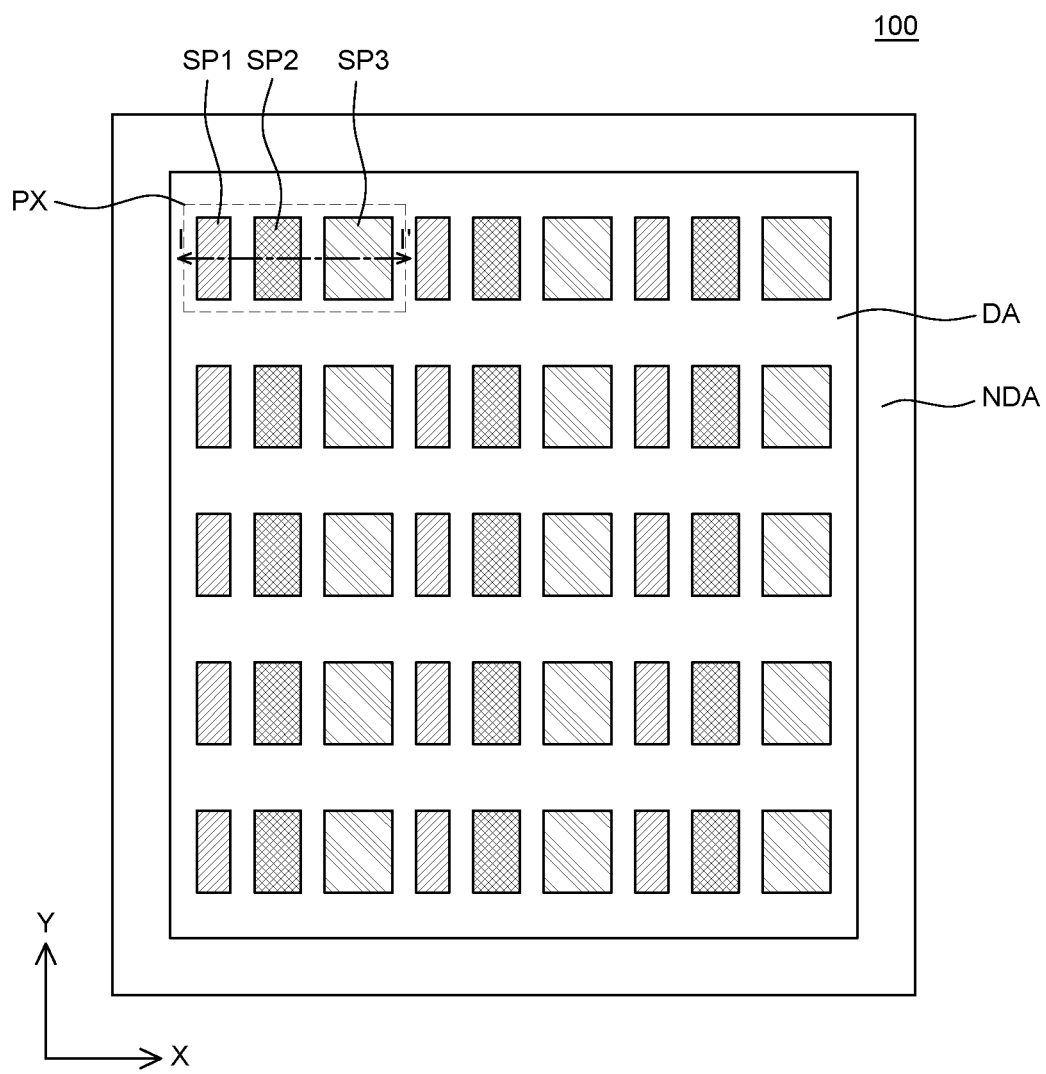
FIG. 1 is a plan view of an organic light emitting display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, an organic light emitting display device according to exemplary embodiments of the present disclosure will be described in detail with reference to accompanying drawings.

FIG. 1 is a plan view of an organic light emitting display device according to an exemplary embodiment of the present disclosure. With reference to FIG. 1, an organic light emitting display device 100 according to an exemplary embodiment of the present disclosure includes a display area DA and a non-display area NDA. The display area DA is an area in which a plurality of pixels PX are disposed to substantially display an image. The pixels PX including a light emitting area for displaying an image and driving circuits for driving the pixel PX may be disposed in the display area DA. The non-display area NDA surrounds the display area DA. The non-display area NDA is an area in which an image is not substantially displayed and various lines, driver ICs, printed circuit boards and the like for driving the pixels and the driving circuits disposed in the display area DA are disposed. For example, various ICs such as a gate driver IC and a data driver IC may be disposed in the non-display area NDA. Meanwhile, as described above, a driver IC, a printed circuit board and the like may be disposed in the non-display area NDA, and the non-display area NDA requires a predetermined area for disposing the driver IC, the printed circuit board, and the like, therein.

The plurality of pixels PX are disposed in a matrix form, and each of the plurality of pixels PX includes a plurality of sub-pixels. The sub-pixel is an element for displaying one color, and includes a light emitting area from which light is emitted and a non-light emitting area from which light is not emitted. However, in this specification, only the light emitting area from which light is emitted is defined as the sub-pixel. One pixel PX includes a first sub-pixel SP1, a second sub-pixel SP2, and a third sub-pixel SP3. For example, the first sub-pixel SP1, the second sub-pixel SP2, and the third sub-pixel SP3 may be alternately arranged in a first direction, but are not limited thereto.

In FIG. 1, each of the first sub-pixel SP1, the second sub-pixel SP2, and the third sub-pixel SP3 is shown as a quadrangular shape, but the shape of the sub-pixels is not limited thereto. The shape of the sub-pixels may be variously changed and for example, each sub-pixel may have a polygonal shape except for a circular shape, an elliptical shape or a quadrangular shape.

The first sub-pixel SP1, the second sub-pixel SP2, and the third sub-pixel SP3 may display colors different from one another, and if necessary, some sub-pixels may display the same color. Each of the first sub-pixel SP1, the second sub-pixel SP2, and the third sub-pixel SP3 may be one of a red sub-pixel, a green sub-pixel, a blue sub-pixel, and a white sub-pixel.

Figure 2:
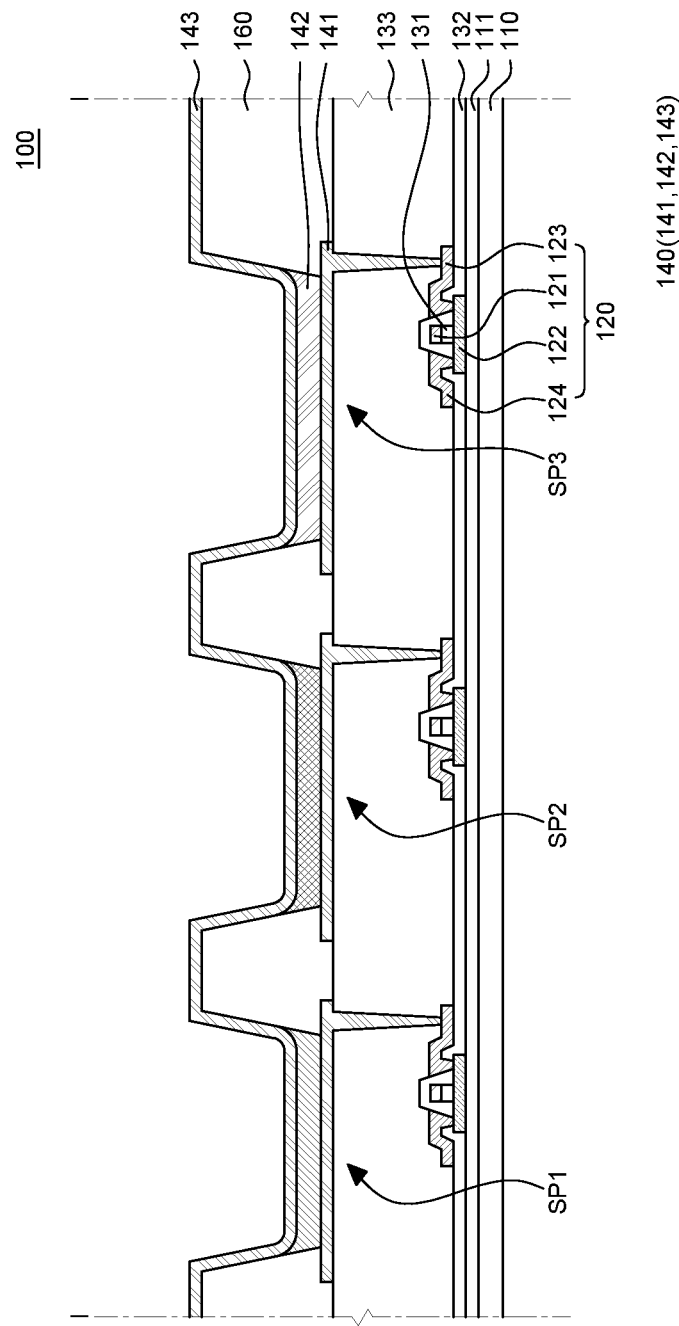
FIG. 2 is a cross-sectional view taken along line I-I' of FIG. 1 according to an embodiment of the present disclosure.
Figure 3:
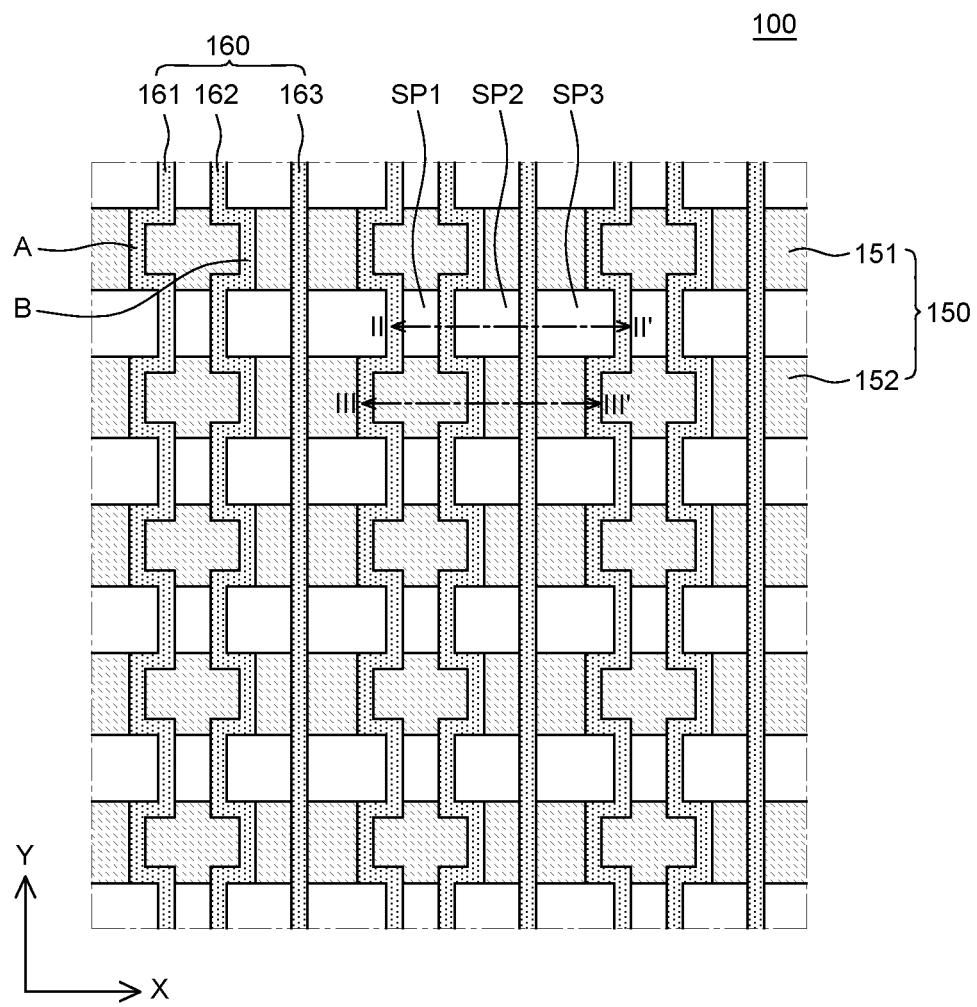
FIG. 3 is a plan view illustrating a horizontal bank and a vertical bank in the organic light emitting display device according to an exemplary embodiment of the present disclosure.

FIG. 2 is a cross-sectional view taken along line I-I' of FIG. 1. FIG. 3 is a plan view illustrating a horizontal bank and a vertical bank in the organic light emitting display device according to an exemplary embodiment of the present disclosure. FIG. 2 illustrates that the organic light emitting display device 100 is driven in a top emission method, by way of example, but the present disclosure is not limited thereto. With reference to FIGS. 2 and 3, the organic light emitting display device 100 according to an exemplary embodiment of the present disclosure includes a substrate 110, a thin film transistor 120, and an organic light emitting element 140. The organic light emitting element 140 includes a first electrode 141, an organic light emitting layer 142, a second electrode 143, and a bank.

The substrate 110 is a substrate for supporting various elements constituting the organic light emitting display device 100, and may be formed of an insulating material. For example, the substrate 110 may be a glass substrate or a plastic substrate. For example, the plastic substrate may be selected from among polyimide, polyethersulfone, polyethylene terephthalate, and polycarbonate, but is not limited thereto.

A buffer layer 111 may be disposed on the substrate 110 to prevent penetration of oxygen or moisture. The buffer layer 111 may be formed of a single layer, or may be formed of a multilayer structure as needed.

The thin film transistor 120 including a gate electrode 121, an active layer 122, a source electrode 123, and a drain electrode 124 is disposed on the buffer layer 111. The thin film transistor 120 is disposed in each of regions of the first sub-pixel SP1, the second sub-pixel SP2, and the third sub-pixel SP3. FIG. 2 illustrates only a driving thin film transistor among various types of thin film transistor 120 that may be included in the organic light emitting display device 100, for convenience of description. For example, the driving thin film transistor may further include a switching thin film transistor, and a sensing thin film transistor. In addition, FIG. 2 illustrates that the thin film transistor 120 has a coplanar structure, by way of example, but it is not limited thereto. The thin film transistor 120 having an inverted staggered structure may also be used.

For example, the active layer 122 is disposed on the buffer layer 111, and a gate insulating layer 131 for insulating the active layer 122 and the gate electrode 121 is disposed on the active layer 122. In addition, an interlayer insulating layer 132 for insulating the gate electrode 121, the source electrode 123, and the drain electrode 124 is disposed on the buffer layer 111. The source electrode 123 and the drain electrode 124 respectively contacting the active layer 122 are formed on the interlayer insulating layer 132. A planarization layer 133 may be disposed on the thin film transistor 120. The planarization layer 133 planarizes an upper portion of the thin film transistor 120. The planarization layer 133 may include a contact hole for electrically connecting the thin film transistor 120 and the first electrode 141 of the organic light emitting element 140.

The organic light emitting element 140 is disposed on the planarization layer 133. The organic light emitting element 140 is disposed in each of the regions of the first sub-pixel SP1, the second sub-pixel SP2, and the third sub-pixel SP3. The organic light emitting element 140 includes the first electrode 141, the organic light emitting layer 142, the second electrode 143, and a bank.

The first electrode 141 is disposed on the planarization layer 133. The first electrode 141 may be formed on the planarization layer 133 to be separated for each of the first sub-pixel SP1, the second sub-pixel SP2, and the third sub-pixel SP3. The first electrode 141 may be an electrode functioning as an anode of the organic light emitting display device 100. The first electrode 141 is a component for supplying holes to the organic light emitting layer 142 and is formed of a conductive material having a high work function. For example, the first electrode 141 may be formed of at least one selected from among indium-tin-oxide (ITO), indium-zinc-oxide (IZO), indium-tin-zinc-oxide (ITZO), tin oxide ($SnO_2$), zinc oxide (ZnO), indium-copper-oxide (ICO), and aluminum:zinc oxide (Al:ZnO, AZO), but is not limited thereto. When the organic light emitting display device 100 is driven in the top emission method, the first electrode 141 may have a structure in which a layer formed of a transparent conductive oxide and a reflective layer formed of a metallic material are stacked. The reflective layer is formed of a metal having high reflectance so that light emitted from the organic light emitting layer 142 can be reflected upwardly.

The bank is disposed on the first electrode 141 and the planarization layer 133. The bank is formed at boundaries between the plurality of sub-pixels to divide adjacent sub-pixel regions. Also, the bank may divide a pixel region composed of the plurality of sub-pixels. The bank may be formed of an insulating material and is disposed to cover edges of the first electrode 141. Therefore, the first electrode 141 which is patterned for each sub-pixel may be insulated by the bank. The bank includes a horizontal bank 150 and a vertical bank 160. In the cross-sectional view illustrated in FIG. 2, a plurality of sub-pixel regions are illustrated as being divided by the vertical bank 160, but each of the plurality of sub-pixels may be surrounded by the horizontal bank 150 and the vertical bank 160. A more detailed description of the bank including the horizontal bank 150 and the vertical bank 160 will be described later.

The organic light emitting layer 142 is disposed on the first electrode 141 which is exposed without being covered by the bank including the horizontal bank 150 and the vertical bank 160. The organic light emitting layer 142 is a layer emitting light by combination of electrons and holes. The organic light emitting layer 142 includes an organic light emitting material having a color corresponding to each of the first sub-pixel SP1, the second sub-pixel SP2, and the third sub-pixel SP3. For example, the first sub-pixel SP1 may a red sub-pixel, the second sub-pixel SP2 may be a green sub-pixel, the third sub-pixel SP3 may be a blue sub-pixel, and the organic light emitting layer 142 disposed on the red sub-pixel may be formed to include an organic light emitting material that emits red light. However, the present disclosure is not limited thereto.

The organic light emitting layer 142 has a U-shape in which a central portion thereof is thin and an edge portion thereof is thick. When the organic light emitting layer 142 is formed through a solution process, the organic light emitting layer 142 has a U-shape due to a difference in drying speed between the central portion and the edge portion during drying of ink. However, a shape of the organic light emitting layer 142 is not limited to the U-shape, and may vary depending on solution process conditions, a composition of the ink, characteristics of a surface to which applied ink contacts, and the like.

The second electrode 143 is disposed on the organic light emitting layer 142 and the bank. The second electrode 143 may be an electrode functioning as a cathode of the organic light emitting display device 100. The second electrode 143 may be formed of a metallic material having a low work function to smoothly supply electrons to the organic light emitting layer 142. For example, the second electrode 143 may be formed of a metallic material selected from calcium (Ca), barium (Ba), aluminum (Al), silver (Ag), and alloys including one or more of them, but is not limited thereto. When the organic light emitting display device 100 is driven in the top emission method, the second electrode 143 is formed to have a very small thickness to allow light emitted from the organic light emitting layer 142 to be transmitted upwardly, and thus, may be substantially transparent. The second electrode 143 is not patterned and is formed as a single layer on the organic light emitting layer 142 and the bank. That is, the second electrode 143 is formed of a continuous layer without being separated for the regions of the first sub-pixel SP1, the second sub-pixel SP2, and the third sub-pixel SP3.

A hole injection layer, a hole transport layer, an electron transport layer, an electron injection layer, and the like may be further included to improve luminous efficiency of the organic light emitting display device 100. For example, a hole injection layer and a hole transport layer may be disposed between the first electrode 141 and the organic light emitting layer 142, and an electron transport layer and an electron injection layer may be disposed between the organic light emitting layer 142 and the second electrode 143.

Hereinafter, the bank including the horizontal bank 150 and the vertical bank 160 in the organic light emitting display device 100 according to an exemplary embodiment will be described in detail with reference to FIGS. 3 to 5.

FIG. 3 is a plan view illustrating a horizontal bank and a vertical bank in the organic light emitting display device according to an exemplary embodiment of the present disclosure. FIG. 4 is a cross-sectional view taken along line II-II' of FIG. 3 according to an embodiment of the present disclosure. FIG. 5 is a cross-sectional view taken along line III-III' of FIG. 3 according to an embodiment of the present disclosure. In FIGS. 4 and 5, only the planarization layer 133, the bank, the first electrode 141, and the organic light emitting layer 142 are illustrated for convenience of description. For convenience of description, a description is made assuming that the organic light emitting layer on the first sub-pixel SP1 is a red organic light emitting layer EML1, the organic light emitting layer on the second sub-pixel SP2 is a green organic light emitting layer EML2, and the organic light emitting layer on the third sub-pixel SP3 is a blue organic light emitting layer EML3, but the present disclosure is not limited thereto.

First, with reference to FIG. 3, the bank includes the horizontal bank 150 and the vertical bank 160. The horizontal bank 150 includes a first horizontal bank 151 and a second horizontal bank 152. The first horizontal bank 151 and the second horizontal bank 152 are alternately arranged in a first direction (Y-axis direction) to cover upper and lower edges (ends) of the first electrode 141. The vertical bank 160 is disposed on the horizontal bank 150 and includes a first vertical bank 161, a second vertical bank 162, and a third vertical bank 163. The first vertical bank 161, the second vertical bank 162, and the third vertical bank 163 are alternately arranged in a second direction (X-axis direction) to cover left and right edges (ends) of the first electrode 141. Accordingly, the bank has a grid-like pattern.

Each of the first horizontal bank 151 and the second horizontal bank 152 may have a shape of a straight line having a constant width. The first horizontal bank 151 and the second horizontal bank 152 surround upper and lower edges of each of the plurality of sub-pixels. Accordingly, a vertical length of each of the plurality of sub-pixels is adjusted by a distance between the first horizontal bank 151 and the second horizontal bank 152. The first vertical bank 161, the second vertical bank 162, and the third vertical bank 163 surround left and right edges of the plurality of sub-pixels. Accordingly, a horizontal length of each of the plurality of sub-pixels is adjusted by distances between the vertical banks 161, 162, and 163.

That is, each of the plurality of sub-pixels is defined as a region exposed without being covered by the horizontal bank 150 and the vertical bank 160. For example, the first sub-pixel SP1 is formed to be surrounded by the first horizontal bank 151, the second horizontal bank 152, the first vertical bank 161, and the second vertical bank 162. For example, the second sub-pixel SP2 is formed to be surrounded by the first horizontal bank 151, the second horizontal bank 152, the second vertical bank 162, and the third vertical bank 163. For example, the third sub-pixel SP3 is formed to be surrounded by the first horizontal bank 151, the second horizontal bank 152, the third vertical bank 163, and the first vertical bank 161.

Areas of the first sub-pixel SP1, the second sub-pixel SP2, and the third sub-pixel SP3 may be the equal to or different from one another according to luminous efficiency of each of the sub-pixels. The sub-pixel having high luminous efficiency may be formed to have a relatively small area, and the sub-pixel having low luminous efficiency may be formed to have a relatively large area. In this case, there is an advantage in that display quality is more excellent due to a low variation in luminance for each color. FIG. 3 illustrates that the area of each of the first sub-pixel SP1, the second sub-pixel SP2, and the third sub-pixel SP3 increases in the order of the first sub-pixel SP1, the second sub-pixel SP2, and the third sub-pixel SP3, but the present disclosure is not limited thereto.

When forming an organic light emitting layer in each sub-pixel region through a solution process, an ink having a color corresponding to each sub-pixel is injected or dropped and then, hardened to form an organic light emitting layer. At this time, when a width of a corresponding sub-pixel is narrow, the ink flows into other sub-pixels adjacent to the sub-pixel, and color mixing easily occurs. Particularly, when widths of the sub-pixels and banks are reduced in order to realize high resolution, the color mixing of ink as described above occurs more frequently, causing defects.

Figure 4:
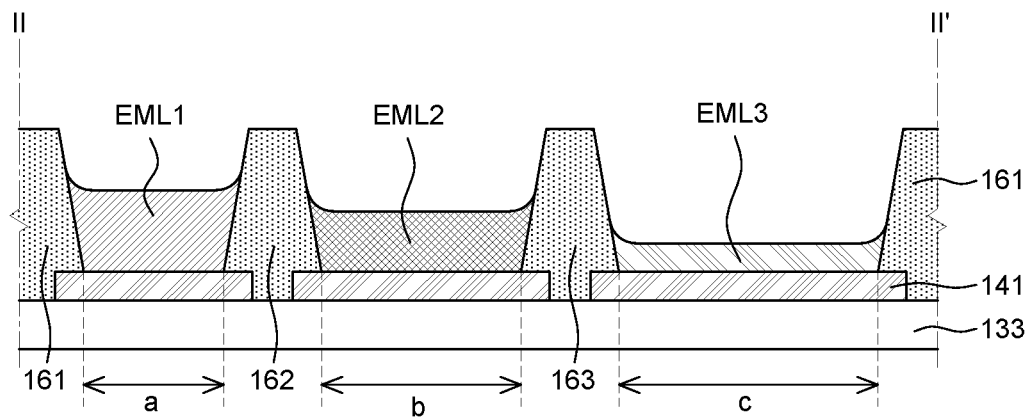
FIG. 4 is a cross-sectional view taken along line II-II' of FIG. 3 according to an embodiment of the present disclosure.
Figure 5:
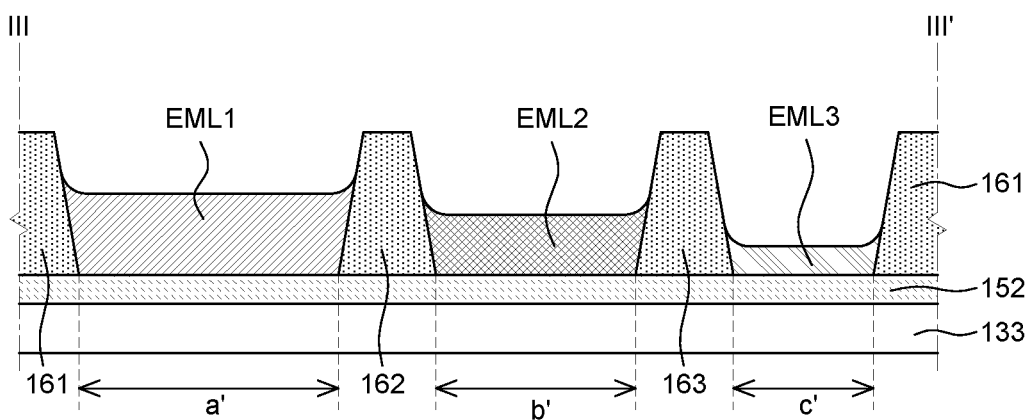
FIG. 5 is a cross-sectional view taken along line III-III' of FIG. 3 according to an embodiment of the present disclosure.

With reference to FIGS. 3, 4 and 5 together, the first vertical bank 161 and the second vertical bank 162 have a plurality of protrusions. The first vertical bank 161 has a left protrusion A at positions thereof overlapping the first horizontal bank 151 and the second horizontal bank 152, that is, at positions where the first vertical bank 161 overlaps the first horizontal bank 151 and the second horizontal bank 152. The second vertical bank 162 has a right protrusion B at positions thereof overlapping the first horizontal bank 151 and the second horizontal bank 152, that is, at positions where second vertical bank 162 overlaps the first horizontal bank 151 and the second horizontal bank 152. Accordingly, a distance a' from the left protrusion A of the first vertical bank 161 to the right protrusion B of the second vertical bank 162 is greater than a short-axis a of the first sub-pixel SP1, that is, a distance a between the first vertical bank 161 and the second vertical bank 162 that surround the first sub-pixel SP1. Accordingly, when forming the red organic light emitting layer EML1 through a solution process, it may be feasible to reduce or minimize color mixing by dropping ink on the first horizontal bank 151 and/or the second horizontal bank 152 that are adjacent to the first sub-pixel SP1 and have a width greater than that of the first sub-pixel SP1. The ink has spreadability, and the organic light emitting layers EML1, EML2, and EML3 should be formed thicker than the first horizontal bank 151 and the second horizontal bank 152 in terms of securing luminous efficiency. That is, the ink is dropped in an amount sufficient to cover the first horizontal bank 151 and the second horizontal bank 152. Accordingly, even if the ink is dropped on the first horizontal bank 151 and/or the second horizontal bank 152, the ink flows into the region of the first sub-pixel SP1. That is, since the ink flows into the region of the first sub-pixel SP1 through upper surfaces of the first horizontal bank 151 and the second horizontal bank 152, an ink layer having a predetermined thickness or more is formed on the first electrode 141 of the first sub-pixel SP1.

When the vertical banks have no protrusion and have a shape of a straight line having a constant width, a width between the vertical banks surrounding any one sub-pixel is constant regardless of positions thereof. Therefore, when the widths of the sub-pixels and banks are reduced in order to realize high resolution, ink mixing frequently occurred during a solution process. However, in the organic light emitting display device 100 according to an exemplary embodiment of the present disclosure, color mixing may be reduced or minimized by changing the shape of the vertical bank 160 to have an area greater than that of the first sub-pixel SP1.

Meanwhile, edges of the left protrusion A of the first vertical bank 161 and edges of the right protrusion B of the second vertical bank 162 are formed to coincide with edges of the first horizontal bank 151 or the second horizontal bank 152. That is, FIG. 3 illustrates that a vertical length of the protrusion is equal to a width of the first horizontal bank 151 or the second horizontal bank 152, but the present disclosure is not limited thereto. For example, the edges of the left protrusion A of the first vertical bank 161 do not coincide with the edges of the first horizontal bank 151 or the second horizontal bank 152, and may be located inside the first horizontal bank 151 or the second horizontal bank 152. That is, the vertical length of the left protrusion A of the first vertical bank 161 may be smaller than the width of the first horizontal bank 151 or the second horizontal bank 152. As described above, the shape is not limited, as long as it includes an area having a width greater than that of the first sub-pixel to thereby provide effects of preventing color mixing of the ink during a solution process.

The third vertical bank 163 does not have a protrusion and has a shape of a straight line having a constant width. Accordingly, a distance b' from the right protrusion B of the second vertical bank 162 to the third vertical bank 163 overlapping the first horizontal bank 151 or the second horizontal bank 152 is smaller than a short-axis b of the second sub-pixel SP2. In addition, the distance b' from the right protrusion B of the second vertical bank 162 to the third vertical bank 163 overlapping the first horizontal bank 151 or the second horizontal bank 152 is smaller than a distance b between the second vertical bank 162 and the third vertical bank 163 that surround the second sub-pixel SP2. Therefore, in the solution process, it is preferable to drop the ink of a color corresponding to the second sub-pixel SP2 on the first electrode 141 of the second sub-pixel SP2 having a large width. In addition, a distance c' from the third vertical bank 163 overlapping the first horizontal bank 151 or the second horizontal bank 152 to the left protrusion A of the first vertical bank 161 is smaller than a short-axis c of the third sub-pixel SP3, that is, a distance c between the third vertical bank 163 and the first vertical bank 161 that surround the third sub-pixel SP3. Therefore, similarly to the second sub-pixel SP2, the ink of a color corresponding to the third sub-pixel SP3 may be dropped on the first electrode 141 of the third sub-pixel SP3 having a large width.

The horizontal bank 150 may be formed of a hydrophilic insulating material. In this case, the organic light emitting layers EML1, EML2, and EML3 can be easily formed through a solution process. When the horizontal bank 150 is formed of a hydrophilic material, wettability of ink is excellent during the solution process and thus, the ink spreads well. That is, the ink is evenly applied to the first electrode 141, whereby uniform organic light emitting layers EML1, EML2, and EML3 may be formed, and display quality may be improved. The horizontal bank 150 is formed to be thinner than the vertical bank 160.

The vertical bank 160 may be formed of an insulating material that is relatively hydrophobic compared to the horizontal bank 150. For example, the hydrophobic insulating material may include a hydrophilic organic insulating material and a highly hydrophobic material such as a fluorine-based compound, but is not limited thereto. When the vertical bank 160 is also formed of a hydrophilic insulating material, ink may flow into adjacent another sub-pixel region through the upper surface of the vertical bank during the solution process. Consequently, if different types of ink are mixed, display quality is degraded due to color mixing. That is, when the horizontal bank 150 is formed of a hydrophilic insulating material and the vertical bank 160 is formed of a hydrophobic insulating material, the wettability of ink increases during the solution process, so that the ink spreads well. In addition, a degree to which ink flows into another sub-pixel region through the upper surface of the vertical bank 160 is reduced, so that problems caused by color mixing may be improved. Furthermore, a high-resolution display device can be implemented more easily. When the widths of the sub-pixels and banks are shortened so as to improve the resolution of the display device, color mixing of ink occurs more frequently in the solution process. However, since color mixing can be reduced or minimized by forming the vertical bank with a hydrophobic insulating material, a high-resolution display device can be easily implemented.

As another example, the vertical bank 160 may include a first layer formed of a hydrophilic insulating material and a second layer disposed on the first layer and formed of a hydrophobic insulating material. In this case, when forming the organic light emitting layers EML1, EML2 and EML3 in the solution process, color mixing can be prevented while ink is spread evenly in all directions due to the horizontal bank 150 and the first layer of the vertical bank 160 formed of a hydrophilic insulating material. Thus, display quality can be further improved. As another example, the vertical bank 160 may be formed of a hydrophilic insulating material, and may have both hydrophilic properties and hydrophobic properties by performing hydrophobic surface treatment on an upper surface thereof. For example, the hydrophobic surface treatment may be performed by depositing or coating a fluorine-based compound exhibiting hydrophobic properties, or by forming a fine pattern to have a hydrophobic surface, but is not limited thereto.

Referring again to FIGS. 3 to 5, the organic light emitting display device 100 according to an exemplary embodiment of the present disclosure can reduce or minimize flowing of ink into other adjacent sub-pixel regions when forming the organic light emitting layers EML1, EML2, and EML3 through a solution process. In the case of dropping ink on a sub-pixel region having a relatively small width, the ink flows into other sub-pixel regions adjacent to the sub-pixel region, and color mixing easily occurs. For example, when the first vertical bank and the second vertical bank have a shape of a straight line, since a width between the first vertical bank and the second vertical bank is equal even at any position, there are difficulties in preventing color mixing, while maintaining the width of the first sub-pixel. Such color mixing occurs more frequently when the widths of the sub-pixels and banks are further reduced to implement a high-resolution display device.

However, in the organic light emitting display device 100 according to an exemplary embodiment of the present disclosure, the first vertical bank 161 has the left protrusion A at the positions thereof overlapping the first horizontal bank 151 and the second horizontal bank 152, and the second vertical bank 162 has the right protrusion B at the positions thereof overlapping the first horizontal bank 151 and the second horizontal bank 152. That is, the first vertical bank 161 and the second vertical bank 162 protrude in different directions at the positions where they overlap the first horizontal bank 151 and the second horizontal bank 152 adjacent to the first sub-pixel SP1, and the width of the first sub-pixel SP1 is maintained. Accordingly, the width a' between the first vertical bank 161 and the second vertical bank 162 is formed to be greater than the width a of the first sub-pixel SP1. Accordingly, by dropping ink in a wide area and forming the organic light emitting layer EML1 on the first sub-pixel SP1 using spreadability of the ink, a phenomenon in which the ink flows into other adjacent pixel regions can be reduced.

Hereinafter, a process of forming an organic light emitting layer through a solution process and effects of preventing color mixing will be described in more detail with reference to FIGS. 6A to 8B together.

FIGS. 6A to 8B are views for describing a process of forming an organic light emitting layer through a solution process in the display device according to an exemplary embodiment of the present disclosure. FIGS. 6A to 8B illustrates that a width of a short-axis (hereinafter, referred to as 'short-axis width') of each sub-pixel increases in the order of the first sub-pixel SP1, the second sub-pixel SP2, and the third sub-pixel SP3, but it is only an example. The present disclosure is not limited thereto. In FIGS. 6A to 8B, for convenience of description, it is assumed that the first sub-pixel SP1 is a red sub-pixel, the second sub-pixel SP2 is a green sub-pixel, and the third sub-pixel SP3 is a blue sub-pixel. However, colors and arrangements of the respective sub-pixels are not limited thereto.

The organic light emitting layer may be formed through a solution process such as inkjet printing or nozzle printing. However, a solution process method is not limited thereto, and the organic light emitting layer may be formed by various solution process methods known to form the organic light emitting layer. When the organic light emitting layer is formed through a solution process, a manufacturing cost can be reduced compared to the case of forming an organic light emitting layer through a deposition process, and a large area display device can be provided.

First, a bank material is applied to a substrate on which the first electrode is patterned, and then, a bank which is patterned in a grid-like shape as shown in FIG. 3 is formed through a photolithography process using a mask. After forming the bank, red ink I1, green ink I2, and blue ink I3 are prepared, and each ink is injected into each injection device. After injecting the ink into the injection device, the ink is applied while scanning the injection device.

Figure 6A:
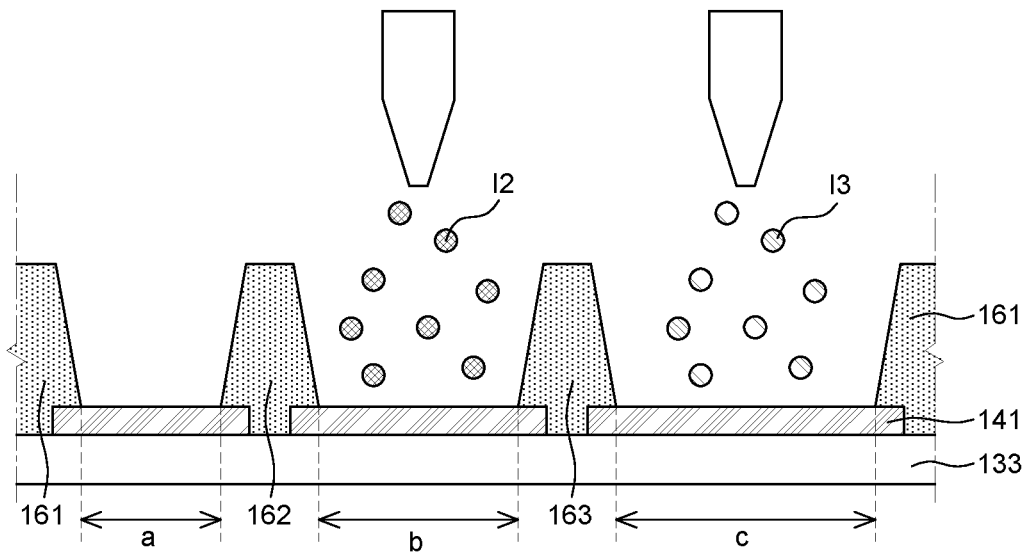
FIGS. 6A and 6B are views for explaining a process of forming an organic light emitting layer through a solution process in an organic light emitting display device according to an exemplary embodiment of the present disclosure.
Figure 6B:
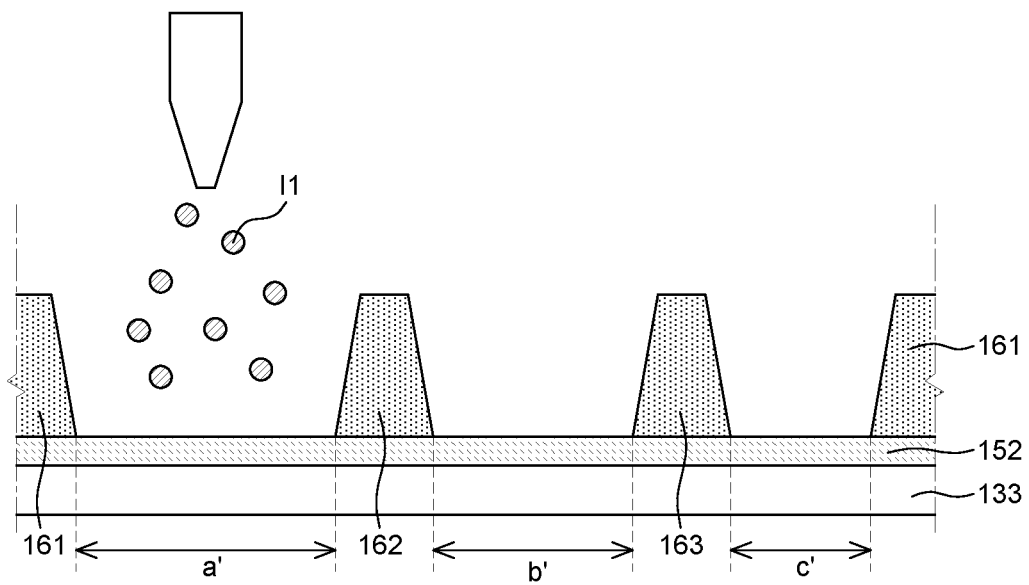

First, with reference to FIGS. 6A and 6B, as described above, the first vertical bank 161 has the left protrusion A at a position where it overlaps the first horizontal bank 151 and the second horizontal bank 152, and the second vertical bank 162 has the right protrusion B at a position where it overlaps the first horizontal bank 151 and the second horizontal bank 152, in an exemplary embodiment of the present disclosure. Accordingly, the distance a' from the left protrusion A of the first vertical bank 161 to the right protrusion B of the second vertical bank 162 is greater than the distance a between the first vertical bank 161 and the second vertical bank 162 that surround the first sub-pixel SP1. The third vertical bank 163 does not have a protrusion and has a constant width. Accordingly, the distance b' from the right protrusion B of the second vertical bank 162 to the third vertical bank 163 overlapping the first horizontal bank 151 or the second horizontal bank 152 is smaller than the distance b between the second vertical bank 162 and the third vertical bank 163 that surround the second sub-pixel SP2. In addition, the distance c' from the third vertical bank 163 overlapping the first horizontal bank 151 or the second horizontal bank 152 to the left protrusion A of the first vertical bank 161 is smaller than the distance c between the third vertical bank 163 and the first vertical bank 161 that surround the third sub-pixel SP3.

In the case of the second sub-pixel SP2 and the third sub-pixel SP3 that are relatively greater in short-axis width than the first sub-pixel SP1, ink is applied onto each sub-pixel region. That is, the green ink I2 is applied onto the first electrode 141 of the second sub-pixel SP2, and the blue ink I3 is applied onto the first electrode 141 of the third sub-pixel SP3. At this time, while scanning the injection device in which the green ink I2 is injected, in the first direction along a plurality of second sub-pixels SP2, the green ink I2 is applied onto the first electrode 141 of each of the second sub-pixels SP2. Further, the blue ink I3 is applied onto the first electrode 141 of the third sub-pixel SP3 using the injection device in which the blue ink I3 is injected, in the same manner.

The first sub-pixel SP1 has a width smaller than those of the second sub-pixel SP2 and the third sub-pixel SP3. Accordingly, when the red ink I1 is applied onto the first electrode 141 of the first sub-pixel SP1 using an injection device of the same specification as those for the green ink and the blue ink, the red ink I1 may flow into other sub-pixel regions through the upper surface of the first vertical bank 161 and/or the second vertical bank 162. That is, the red ink I1 may flow into the region of the second sub-pixel SP2 through the upper surface of the second vertical bank 162. Accordingly, color mixing of the red ink I1 and the green ink I2 may occur in the region of the second sub-pixel SP2. Also, the red ink I1 may flow into the region of the third sub-pixel SP3 through the upper surface of the first vertical bank 161. Accordingly, color mixing of the red ink I1 and the blue ink I3 may occur in the region of the third sub-pixel SP3. When ink color mixing occurs as described above, color gamut of the display device is degraded, thereby lowering display quality.

In the case of the first sub-pixel SP1 having a relatively narrow width, the red ink I1 is applied onto the first horizontal bank 151 and/or the second horizontal bank 152 adjacent to the first sub-pixel SP1, as shown in FIG. 6B, in order to reduce or minimize color mixing. When the ink is applied onto the first horizontal bank 151 and/or the second horizontal bank 152 adjacent to the first sub-pixel SP1 and greater in width than the first sub-pixel SP1, color mixing can be reduced or minimized. The red ink I1 is also applied onto the horizontal banks 151 and 152 while scanning the injection device along the first direction in which the plurality of first sub-pixels SP1 are disposed.

Heights of the first horizontal bank 151 and the second horizontal bank 152 are lower than thicknesses of the red organic light emitting layer EML1, the green organic light emitting layer EML2, and the blue organic light emitting layer EML3 that are finally formed.

To form the thicknesses of the organic light emitting layers greater than those of the horizontal banks, the red ink I1, the blue ink I3, and the green ink I2 are applied in an amount sufficient to cover the first horizontal bank 151 and the second horizontal bank 152 in the solution process.

The applications of the red ink I1, the green ink I2 and the blue ink I3 may be performed simultaneously, or may be performed sequentially, and the order of applications is not particularly limited. FIGS. 7A to 8B illustrate a case in which the red ink I1, the green ink I2 and the blue ink I3 are simultaneously applied, but the present disclosure is not limited thereto.

Figure 7A:
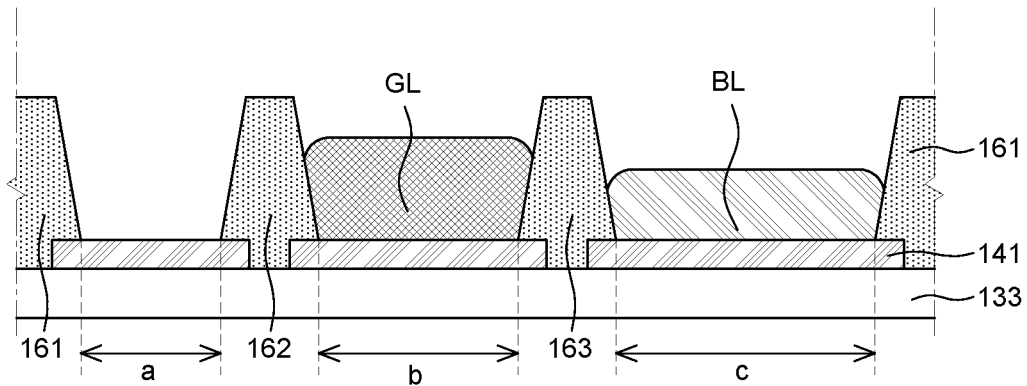
FIGS. 7A and 7B are views for explaining a process of forming an organic light emitting layer through a solution process in an organic light emitting display device according to an exemplary embodiment of the present disclosure.
Figure 7B:
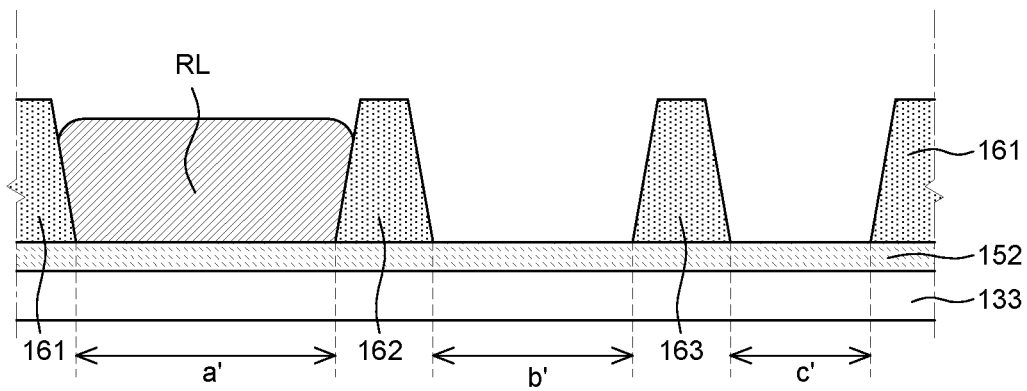

With reference to FIG. 7A, immediately after simultaneously applying the red ink I1, the green ink I2, and the blue ink I3, a green ink layer GL is formed on the first electrode 141 of the second sub-pixel SP2 and a blue ink layer BL is formed on the first electrode 141 of the third sub-pixel SP3. Meanwhile, when the amount of ink applied to each of the second sub-pixel SP2 and the third sub-pixel SP3 is the same, the blue ink layer BL on the region of the third sub-pixel SP3 which is relatively greater in short-axis width may be formed thinner than the green ink layer GL on the region of the second sub-pixel SP2.

The red ink I1 is not applied onto the first electrode 141 of the first sub-pixel SP1, but is applied onto the horizontal bank 152 adjacent to the first sub-pixel SP1.

Since the ink used to form the organic light emitting layer has spreadability, and the thicknesses of the red organic light emitting layer EML1, the green organic light emitting layer EML2, and the blue organic light emitting layer EML3 that are finally formed are greater than the heights of the first horizontal bank 151 and the second horizontal bank 152 as described above, the ink is applied in an amount sufficient to cover the horizontal banks 151 and 152. That is, even when the red ink I1 is applied to the horizontal banks 151 and 152, the red ink I1 passes through the first horizontal bank 151 and the second horizontal bank 152. Accordingly, a red ink layer RL is also formed on the first electrode 141 of the first sub-pixel SP1. That is, the red ink layer RL is formed to cover the first horizontal bank 151 and the second horizontal bank 152, and the first electrode 141 between the first vertical bank 161 and the second vertical bank 162.

For the same reason, the green ink I2 is applied onto the first electrode 141 of the second sub-pixel SP2, but passes through the adjacent first horizontal bank 151 and second horizontal bank 152. Accordingly, the green ink layer GL is formed not only on the second sub-pixel SP2 but also formed on the first horizontal bank 151 and the second horizontal bank 152. Similarly, the blue ink layer BL is formed not only on the first electrode 141 of the third sub-pixel SP3 but also formed on the adjacent first horizontal bank 151 and second horizontal bank 152. That is, the green ink layer GL is formed to cover the first horizontal bank 151 and the second horizontal bank 152, and the first electrode 141 between the second vertical bank 162 and the third vertical bank 163. In addition, the blue ink layer BL is formed to cover the first horizontal bank 151 and the second horizontal bank 152, and the first electrode 141 between the third vertical bank 163 and the first vertical bank 161.

Thereafter, when the ink layers are dried, they are hardened to form organic light emitting layers.

Since distances between the vertical banks surrounding respective sub-pixel regions and shapes of the vertical banks are different, the respective sub-pixel regions have different volumes. Accordingly, even when the amounts of the red ink I1, the green ink I2, and the blue ink I3 that are used to form the organic light emitting layers are identical to one another, the red organic light emitting layer EML1, the green organic light emitting layer EML2, and the blue organic light emitting layer EML3 are formed to have different thicknesses.

Figure 8A:
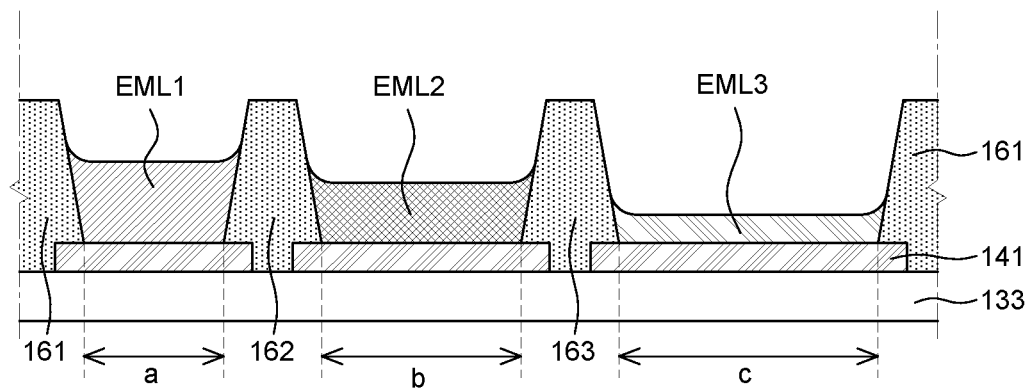
FIGS. 8A and 8B are views for explaining a process of forming an organic light emitting layer through a solution process in an organic light emitting display device according to an exemplary embodiment of the present disclosure.

With reference to FIG. 8A, even when the amounts of the red ink I1, the green ink I2, and the blue ink I3 that are used in manufacturing organic light emitting layers are equal to one another, the thickness of the red organic light emitting layer EML1 formed on the first sub-pixel SP1 which is relatively small in short-axis width, is the greatest. On the contrary, the thickness of the blue organic light emitting layer EML3 formed on the third sub-pixel SP3 which is relatively great in short-axis width is smallest. However, the thickness of each organic light emitting layer is not limited thereto, and may be changed as necessary.

Figure 8B:
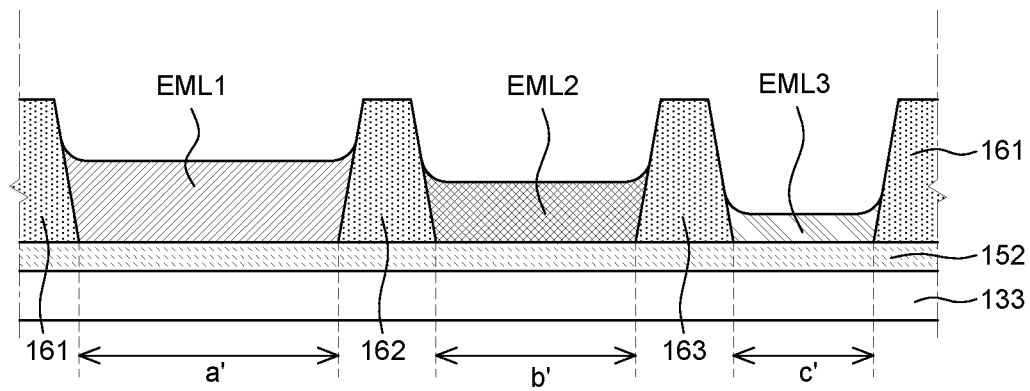

With reference to FIG. 8B, since each ink is applied in an amount sufficient to cover the horizontal bank, the red organic light emitting layer EML1, the green organic light emitting layer EML2, and the blue organic light emitting layer EML3 are also formed on the horizontal bank adjacent to each sub-pixel, respectively. However, the red organic light emitting layer EML1, the green organic light emitting layer EML2, and the blue organic light emitting layer EML3 formed on the horizontal bank are insulated from the first electrode 141 by the horizontal bank and the vertical bank, and thus, do not emit light even when a voltage is applied to the organic light emitting display device 100.

Meanwhile, when the ink layer is dried, a pile-up phenomenon occurs at an edge of each sub-pixel region. Accordingly, each organic light emitting layer has a U-shape in which the central portion thereof is thin and the edge portion thereof is thick. When a thickness variation between the central portion and the edge portion exists as described above, light is emitted from the organic light emitting layer non-uniformly. Accordingly, image quality of the display device is degraded and a driving voltage increases or leakage current is generated, thereby leading to a decrease in lifespan.

According to an exemplary embodiment of the present disclosure, the first vertical bank 161 has the left protrusion A and the second vertical bank 162 has the right protrusion B, whereby thickness variations as described above can be reduced, and the thicknesses of the organic light emitting layers can decrease. According to an exemplary embodiment of the present disclosure illustrated in FIG. 3, the first vertical bank 161 has the left protrusion A at the position thereof overlapping the first horizontal bank 151 and the second horizontal bank 152, and the second vertical bank 162 has the right protrusion B at the position thereof overlapping the first horizontal bank 151 and the second horizontal bank 152. Accordingly, a distance between the first vertical bank 161 and the second vertical bank 162 on the first horizontal bank 151 and the second horizontal bank 152 is extended more than a distance between the first vertical bank 161 and the second vertical bank 162 that surround the first sub-pixel SP1.

Unlike this, in the case of a comparative example in which the first vertical bank and the second vertical bank have no protrusions and have a shape of a straight line with a constant width, a distance between the first vertical bank and the second vertical bank is constant even at any position.

Accordingly, according to an exemplary embodiment of the present disclosure, a volume between the first vertical bank 161 and the second vertical bank 162 is increased by about 15% compared to the comparative example. Therefore, when the same amount of red ink I1 as in the comparative example is applied, the red organic light emitting layer EML1 according to an exemplary embodiment of the present disclosure is formed to have a thickness which is smaller than that of the comparative example. Further, the pile-up phenomenon is reduced or minimized when the distance between the left protrusion A of the first vertical bank 161 and the right protrusion B of the second vertical bank 162 increases by increasing the widths of the horizontal banks 151 and 152 or decreasing the widths of the vertical banks 161 and 162. Accordingly, organic light emitting layers of more uniform thicknesses can be formed.

Figure 9:
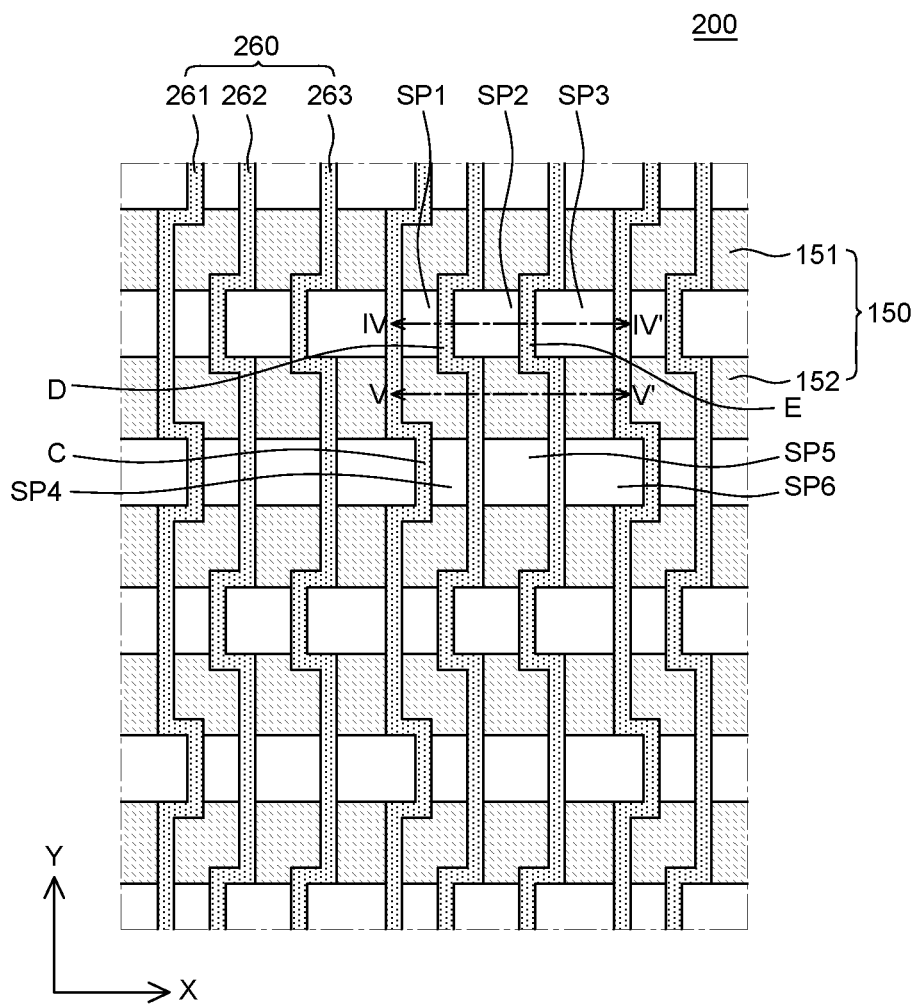
FIG. 9 is a plan view illustrating a horizontal bank and a vertical bank in an organic light emitting display device according to another exemplary embodiment of the present disclosure.
Figure 10:
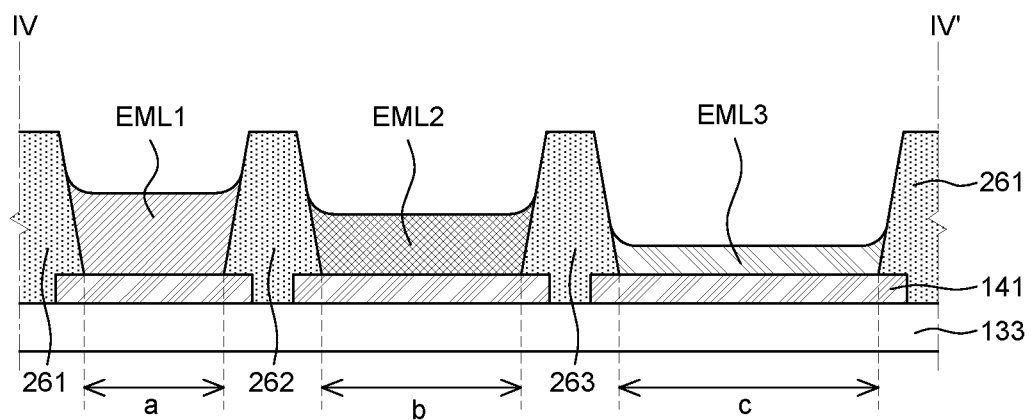
FIG. 10 is a cross-sectional view taken along line IV-IV' of FIG. 9 according to an embodiment of the present disclosure.
Figure 11:
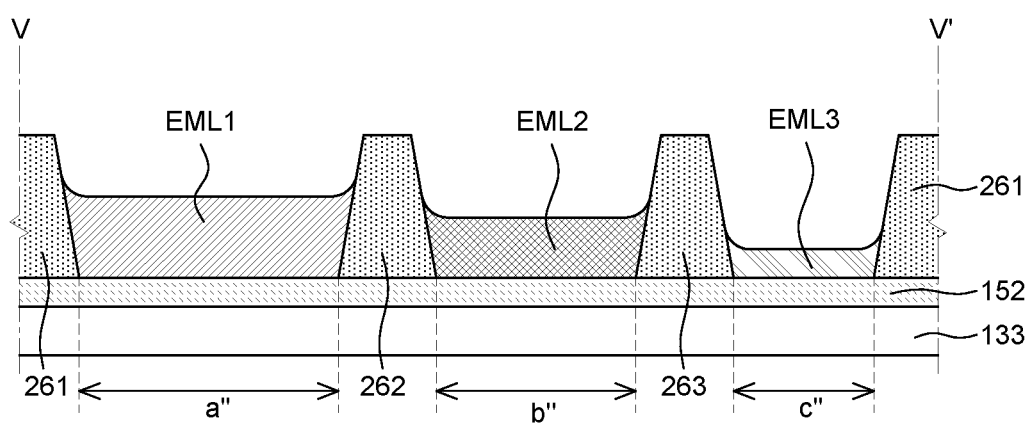
FIG. 11 is a cross-sectional view taken along line V-V' in FIG. 9 according to an embodiment of the present disclosure.

FIGS. 9 to 11 are views for explaining a display device according to another exemplary embodiment of the present disclosure. FIG. 9 is a plan view illustrating a horizontal bank and a vertical bank in an organic light emitting display device according to another exemplary embodiment of the present disclosure. FIG. 10 is a cross-sectional view taken along line IV-IV' of FIG. 9 according to an embodiment of the present disclosure. FIG. 11 is a cross-sectional view taken along line V-V' in FIG. 9 according to an embodiment of the present disclosure.

An organic light emitting display device 200 according to another exemplary embodiment of the present disclosure is substantially the same as the organic light emitting display device 100 illustrated in FIG. 3, with the exception that it further includes a fourth sub-pixel SP4, a fifth sub-pixel SP5, and a sixth sub-pixel SP6, shapes of protrusions of a first vertical bank 261 and a second vertical bank 262 are different from those of the organic light emitting display device 100, and a third vertical bank 263 has a protrusion. Therefore, duplicate descriptions are omitted. FIG. 9 illustrates that a short-axis width of each sub-pixel increases in the order of the fourth sub-pixel SP4, the fifth sub-pixel SP5, and the sixth sub-pixel SP6, but the present disclosure is not limited thereto.

With reference to FIG. 9, the organic light emitting display device 200 according to another exemplary embodiment of the present disclosure includes the first sub-pixel SP1, the second sub-pixel SP2, the third sub-pixel SP3, the fourth sub-pixel SP4, the fifth sub-pixel SP5, and the sixth sub-pixel SP6.

The fourth sub-pixel SP4 may be a sub-pixel having the same color as the first sub-pixel SP1, the fifth sub-pixel SP5 may be a sub-pixel having the same color as the second sub-pixel SP2, the sixth sub-pixel SP6 may be a sub-pixel having the same color as the third sub-pixel SP3. Hereinafter, for convenience of description, a description is made assuming that the first sub-pixel SP1 and the fourth sub-pixel SP4 are red sub-pixels, the second sub-pixel SP2 and the fifth sub-pixel SP5 are green sub-pixels, and the third sub-pixel SP3 and the sixth sub-pixel SP6 are blue sub-pixels, but the present disclosure is not limited thereto.

Each of the first vertical bank 261, the second vertical bank 262 and the third vertical bank 263 may have a plurality of protrusions. The first vertical bank 261 overlaps the first horizontal banks 151 and the second horizontal banks 152 and have right protrusions C which protrude toward the fourth sub-pixels SP4. The second vertical bank 262 overlaps the first horizontal banks 151 and the second horizontal banks 152 and have left protrusions D which protrude toward the first sub-pixels SP1.

Accordingly, the first sub-pixel SP1 is formed to be surrounded by the first horizontal bank 151, the second horizontal bank 152, the first vertical bank 261, and the left protrusion D of the second vertical bank 262. The fourth sub-pixel SP4 is spaced apart from the first sub-pixel SP1 in a first direction and is formed to be surrounded by the first horizontal bank 151, the second horizontal bank 152, the right protrusion C of the first vertical bank 261, and the second vertical bank 262. A short-axis width a of the first sub-pixel SP1 may be the same as a short-axis width of the fourth sub-pixel SP4. That is, a distance between the right protrusion C of the first vertical bank 261 and the second vertical bank 262 that surround the fourth sub-pixel SP4 is equal to a distance a between the first vertical bank and the left protrusion D of the second vertical bank 262 that surround the first sub-pixel SP1.

A distance a" between the first vertical bank 261 and the second vertical bank 262 that overlap the first horizontal bank 151 or the second horizontal bank 152 adjacent to the fourth sub-pixel SP4 is greater than the short-axis width of the fourth sub-pixel SP4, that is, the distance between the right protrusion C of the first vertical bank 261 and the second vertical bank 262 that surround the fourth sub-pixel SP4.

When forming the red organic light emitting layer EML1 through the solution process, color mixing can be reduced or minimized by dropping red ink on the first horizontal bank 151 and/or the second horizontal bank 152 adjacent to the regions of the first sub-pixel SP1 and the fourth sub-pixel SP4 having relatively small widths. When red ink is dropped on the first sub-pixel SP1 and the fourth sub-pixel SP4 that are relatively smaller in width than other sub-pixels, the red ink may pass through an upper surface of the first vertical bank 261 or the second vertical bank 262 and flow into adjacent other sub-pixel regions, whereby color mixing may easily occur.

In the organic light emitting display device 200 according to another exemplary embodiment of the present disclosure, the first vertical bank 261 and the second vertical bank 262 have the protrusions C and D in positions where they overlap the first horizontal bank 151 and the second horizontal bank 152. Accordingly, regions wider than first sub-pixel SP1 and the fourth sub-pixel SP4 are formed. Thus, the red ink is dropped on the first horizontal bank 151 or the second horizontal bank 152 which provides the width a" greater than the short-axis width a of the first sub-pixel SP1 and the fourth sub-pixel SP4. In this case, the red organic light emitting layer EML1 may be formed on the first electrodes 141 of the first sub-pixel SP1 and the fourth sub-pixel SP4 using spreadability of the ink while reducing or minimizing color mixing.

The first sub-pixel SP1 and the fourth sub-pixel SP4 are alternately arranged in the first direction. In this case, the first sub-pixel SP1 and the fourth sub-pixel SP4 are not disposed in straight lines by the right protrusion C of the first vertical bank 261 and the left protrusion D of the second vertical bank 262 and are disposed in a zigzag manner. Accordingly, there is an effect of reducing a thickness variation in the organic light emitting layer EML1. When the sub-pixels are disposed in a zigzag manner, a phenomenon in which ink moves from the central portion to the edge portion thereof when drying ink layers is reduced. Accordingly, the thickness variation between the edge portion and the central portion is reduced.

The third vertical bank 263 overlaps the first horizontal banks 151 and the second horizontal banks 152 and have left protrusions E which protrude toward the second sub-pixels SP2. Accordingly, the second sub-pixel SP2 is formed to be surrounded by the first horizontal bank 151, the second horizontal bank 152, the left protrusion D of the second vertical bank 262, and the left protrusion E of the third vertical bank 263. The fifth sub-pixel SP5 is spaced apart from the second sub-pixel SP2 in the first direction and is formed to be surrounded by the first horizontal bank 151, the second horizontal bank 152, the second vertical bank 262, and the third vertical bank 263. A short-axis width b of the second sub-pixel SP2 may be equal to a short-axis width of the fifth sub-pixel SP5. That is, a distance b between the left protrusion D of the second vertical bank 262 and the left protrusion E of the third vertical bank 263 that surround the second sub-pixels SP2 may be equal to a distance between the second vertical bank 262 and the third vertical bank 263 that surround the fifth sub-pixel SP5.

A long-axis width b" between the second vertical bank 262 and the third vertical bank 263 that overlap the first horizontal bank 151 or the second horizontal bank 152 adjacent to the second sub-pixel SP2 may be equal to the short-axis width b of the second sub-pixel SP2, that is, the distance b between the left protrusion D of the second vertical bank 262 and the left protrusion E of the third vertical bank 263 that surround the second sub-pixel SP2. Accordingly, green ink may be dropped on the first electrodes 141 of the second sub-pixel SP2 and the fifth sub-pixel SP5, or may be dropped on the second sub-pixel SP2 and the fifth sub-pixel SP5 between the first horizontal bank 151 and the second horizontal bank 152.

The second sub-pixel SP2 and the fifth sub-pixel SP5 are alternately arranged in the first direction. At this time, the second sub-pixel SP2 and the fifth sub-pixel SP5 are not disposed in straight lines by the left protrusion D of the second vertical bank 262 and the left protrusion E of the third vertical bank 263 and are disposed in a zigzag manner. As described above, as the second sub-pixel SP2 and the fifth sub-pixel SP5 are disposed in a zigzag manner, a thickness variation in the organic light emitting layer EML2 may be reduced.

In addition, the third sub-pixel SP3 is formed to be surrounded by the first horizontal bank 151, the second horizontal bank 152, the left protrusion E of the third vertical bank 263, and the first vertical bank 261. The sixth sub-pixel SP6 is spaced apart from the third sub-pixel SP3 in the first direction and is formed to be surrounded by the first horizontal bank 151, the second horizontal bank 152, the third vertical bank 263, and the right protrusion C of the first vertical bank 261. A short-axis width c of the third sub-pixel SP3 may be the same as a short-axis width of the sixth sub-pixel SP6. That is, a distance c between the left protrusion E of the third vertical bank 263 and the first vertical bank 261 that surround the third sub-pixel SP3 may be equal to a distance between the third vertical bank 263 and the right protrusion C of the first vertical bank 261 that surround the sixth sub-pixel SP6.

A distance c" between the third vertical bank 263 and the first vertical bank 261 that overlap the first horizontal bank 151 or the second horizontal bank 152 adjacent to the third sub-pixel SP3 may be smaller than the short-axis width c of the third sub-pixel SP3, that is, a long-axis width c between the left protrusion E of the third vertical bank 263 and the first vertical bank 261 that surround the third sub-pixel SP3.

The third sub-pixel SP3 and the sixth sub-pixel SP6 are alternately arranged in the first direction by the left protrusion E of the third vertical bank 263 and the right protrusion C of the first vertical bank 261 and are disposed in a zigzag manner. As described above, as the third sub-pixel SP3 and the sixth sub-pixel SP6 are disposed in a zigzag manner, a thickness variation in the organic light emitting layer EML3 may be reduced.

In another exemplary embodiment of the present disclosure, the first vertical bank 261 has the right protrusion C, and the second vertical bank 262 and the third vertical bank 263 have the left protrusions D and E. The thicknesses of the organic light emitting layers can be formed thinner while reducing the thickness variations of the above organic light emitting layers. According to another exemplary embodiment of the present disclosure illustrated in FIG. 9, the first vertical bank 261 has the right protrusion C and the second vertical bank 262 has the left protrusion D. The right protrusion C protrudes toward the fourth sub-pixel SP4 and overlaps the first horizontal bank 151 and the second horizontal bank 152. The left protrusion D protrudes toward the first sub-pixel SP1 and overlaps the first horizontal bank 151 and the second horizontal bank 152. Accordingly, the distance a" between the first vertical bank 261 and the second vertical bank 262 on the first horizontal bank 151 and the second horizontal bank 152 is extended more than the short-axis width a of the first sub-pixel SP1 and the fourth sub-pixel SP4. Unlike this, in the case of a comparative example in which the first vertical bank and the second vertical bank have no protrusions and have a shape of a straight line with a constant width, the distance between the first vertical bank and the second vertical bank is constant even at any position. As a result, according to another exemplary embodiment of the present disclosure, a volume between the first vertical bank 261 and the second vertical bank 262 is increased by about 13% compared to the comparative example. Accordingly, when the same amount of red ink as in the comparative example is applied, the red organic light emitting layer EML1 having a thickness smaller than that of the comparative example is formed, and the width of the region to which the ink is applied is extended, whereby the red organic light emitting layer EML1 having a more uniform thickness, compared to the comparative example, may be formed.

The exemplary embodiments of the present disclosure can also be described as follows.

According to an aspect of the present disclosure, an organic light emitting display device includes a plurality of sub-pixels including a first sub-pixel, a second sub-pixel, and a third sub-pixel; a first electrode disposed on each of the plurality of sub-pixels, a horizontal bank including a first horizontal bank and a second horizontal bank that are alternately arranged in a first direction to cover edges of the first electrodes; a vertical bank including a first vertical bank, a second vertical bank, and a third vertical bank that are alternately arranged in a second direction to cover edges of the first electrode and disposed on the horizontal bank, an organic light emitting layer disposed on the first electrode, and a second electrode disposed on the organic light emitting layer, wherein the first sub-pixel is surrounded by the first horizontal bank, the second horizontal bank, the first vertical bank, and the second vertical bank, wherein the second sub-pixel is surrounded by the first horizontal bank, the second horizontal bank, the second vertical bank, and the third vertical bank, wherein the third sub-pixel is surrounded by the first horizontal bank, the second horizontal bank, and the first vertical bank, wherein a distance between the first vertical bank and the second vertical bank disposed on the first horizontal bank or the second horizontal bank adjacent to the first sub-pixel is greater than a distance between the first vertical bank and the second vertical bank surrounding the first sub-pixel.

The horizontal bank may be formed of a hydrophilic insulating material, and the vertical bank may be formed of a hydrophobic insulating material.

The first vertical bank may have a left protrusion at positions thereof overlapping the first horizontal bank and the second horizontal bank, the second vertical bank may have a right protrusion at positions thereof overlapping the first horizontal bank and the second horizontal bank.

A distance from the left protrusion of the first vertical bank to the right protrusion of the second vertical bank may be greater than the distance between the first vertical bank and the second vertical bank surrounding the first sub-pixel.

A distance from the right protrusion of the second vertical bank to the third vertical bank overlapping the first horizontal bank or the second horizontal bank may be smaller than a distance between the second vertical bank and the third vertical bank surrounding the second sub-pixel.

A distance from the third vertical bank overlapping the first horizontal bank or the second horizontal bank to the left protrusion of the first vertical bank may be smaller than a distance between the third vertical bank and the first vertical bank surrounding the third sub-pixel.

The third vertical bank may have a shape of a straight line.

The plurality of sub-pixels may further include a fourth sub-pixel, a fifth sub-pixel and a sixth sub-pixel, the fourth sub-pixel may be spaced apart from the first sub-pixel in the first direction and may be surrounded by the first horizontal bank, the second horizontal bank, the first vertical bank, and the second vertical bank, the fifth sub-pixel may be spaced apart from the second sub-pixel in the first direction and may be surrounded by the first horizontal bank, the second horizontal bank, the second vertical bank, and the third vertical bank, the sixth sub-pixel may be spaced apart from the third sub-pixel in the first direction and may be surrounded by the first horizontal bank, the second horizontal bank, the third vertical bank, and the first vertical bank, a distance between the first vertical bank and the second vertical bank disposed on the first horizontal bank or the second horizontal bank adjacent to the fourth sub-pixel may be greater than a distance between the first vertical bank and the second vertical bank surrounding the fourth sub-pixel.

The first vertical bank may overlap the first horizontal bank and the second horizontal bank and may have a right protrusion protruding toward the fourth sub-pixel, the second vertical bank may have a left protrusion which protrudes toward the first sub-pixel and may overlap the first horizontal bank and the second horizontal bank, the third vertical bank may have a left protrusion which protrudes toward the second sub-pixel and may overlap the first horizontal bank and the second horizontal bank.

The distance between the first vertical bank and the second vertical bank that overlap the first horizontal bank or the second horizontal bank adjacent to the fourth sub-pixel may be greater than a distance between the right protrusion of the first vertical bank and the second vertical bank surrounding the fourth sub-pixel.

The distance between the right protrusion of the first vertical bank and the second vertical bank surrounding the fourth sub-pixel may be equal to a distance between the first vertical bank and the left protrusion of the second vertical bank surrounding the first sub-pixel, the first sub-pixel and the fourth sub-pixel may be alternately arranged in the first direction and are disposed in a zigzag manner.

A distance between the second vertical bank and the third vertical bank that overlap the first horizontal bank or the second horizontal bank adjacent to the second sub-pixel may be equal to a distance between the left protrusion of the second vertical bank and the left protrusion of the third vertical bank.

The distance between the left protrusion of the second vertical bank and the left protrusion of the third vertical bank may be equal to a distance from the second vertical bank surrounding the fifth sub-pixel to the third vertical bank, the second sub-pixel and the fifth sub-pixel may be alternately arranged in the first direction and may be disposed in a zigzag manner.

A distance between the third vertical bank and the first vertical bank that overlaps the first horizontal bank or the second horizontal bank adjacent to the third sub-pixel may be smaller than a distance from the left protrusion of the third vertical bank to the first vertical bank surrounding the third sub-pixel.

The distance from the left protrusion of the third vertical bank to the first vertical bank surrounding the third sub-pixel may be equal to a distance from the third vertical bank surrounding the sixth sub-pixel to the right protrusion of the first vertical bank, the third sub-pixel and the sixth sub-pixel may be alternately arranged in the first direction and are disposed in a zigzag manner.

The first sub-pixel may be a sub-pixel having luminous efficiency higher than those of the second sub-pixel and the third sub-pixel.

The first sub-pixel may be a red sub-pixel, and each of the second sub-pixel and the third sub-pixel may be a green sub-pixel or a blue sub-pixel.

An area of each of the first sub-pixel, the second sub-pixel, and the third sub-pixel may be formed such that the area of the first sub-pixel is smallest and the area of the third sub-pixel is largest.

The organic light emitting layer may be formed through inkjet printing or nozzle printing.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device, which includes a plurality of sub-pixels including a first sub-pixel, a second sub-pixel, and a third sub-pixel, the organic light emitting display device comprising:
   a substrate;
   a first electrode disposed on the substrate corresponding to each of the plurality of sub-pixels;
   a horizontal bank including a plurality of first horizontal banks and a plurality of second horizontal banks, wherein each first horizontal bank and each second horizontal bank are alternately arranged in a first direction to cover edges of the first electrodes;
a vertical bank including a plurality of first vertical banks, a plurality of second vertical banks, and a plurality of third vertical banks, wherein each first vertical bank, each second vertical bank, and each third vertical bank are alternately arranged in a second direction to cover edges of the first electrode and disposed on the horizontal bank;
an organic light emitting layer disposed on the first electrode; and
a second electrode disposed on the organic light emitting layer,
wherein the first sub-pixel is an area defined by the first horizontal bank, the second horizontal bank, the first vertical bank, and the second vertical bank,
wherein the second sub-pixel is an area defined by the first horizontal bank, the second horizontal bank, the second vertical bank, and the third vertical bank,
wherein the third sub-pixel is an area defined by the first horizontal bank, the second horizontal bank, the third vertical bank, and the first vertical bank,
wherein a distance between the first vertical bank and the second vertical bank disposed on the first horizontal bank or the second horizontal bank adjacent to the first sub-pixel is greater than a distance between the first vertical bank and the second vertical bank defining the first sub-pixel.

2. The organic light emitting display device of claim 1, wherein the horizontal bank is formed of a hydrophilic insulating material, and the vertical bank is formed of a hydrophobic insulating material.

3. The organic light emitting display device of claim 1, wherein the first vertical bank has a left protrusion at positions overlapping the first horizontal bank and the second horizontal bank,
wherein the second vertical bank has a right protrusion at positions overlapping the first horizontal bank and the second horizontal bank.

4. The organic light emitting display device of claim 3, wherein a distance from the left protrusion of the first vertical bank to the right protrusion of the second vertical bank is greater than the distance between the first vertical bank and the second vertical bank defining the first sub-pixel.

5. The organic light emitting display device of claim 3, wherein a distance from the right protrusion of the second vertical bank to the third vertical bank overlapping the first horizontal bank or the second horizontal bank is smaller than a distance between the second vertical bank and the third vertical bank defining the second sub-pixel.

6. The organic light emitting display device of claim 3, wherein a distance from the third vertical bank overlapping the first horizontal bank or the second horizontal bank to the left protrusion of the first vertical bank is smaller than a distance between the third vertical bank and the first vertical bank defining the third sub-pixel.

7. The organic light emitting display device of claim 3, wherein the third vertical bank has a shape of a straight line.

8. The organic light emitting display device of claim 1, wherein the plurality of sub-pixels further includes a fourth sub-pixel, a fifth sub-pixel, and a sixth sub-pixel,
wherein the fourth sub-pixel is spaced apart from the first sub-pixel in the first direction and is located between adjacent first sub-pixels and is defined by the first horizontal bank, the second horizontal bank, the first vertical bank, and the second vertical bank and the first sub-pixel and the fourth sub-pixel are alternately arranged in the first direction and are disposed in a zigzag manner,
wherein the fifth sub-pixel is spaced apart from the second sub-pixel in the first direction and is located between adjacent second sub-pixels and is defined by the first horizontal bank, the second horizontal bank, the second vertical bank, and the third vertical bank and the second sub-pixel and the fifth sub-pixel are alternately arranged in the first direction and are disposed in a zigzag manner,
wherein the sixth sub-pixel is spaced apart from the third sub-pixel in the first direction and is located between adjacent third sub-pixels and is defined by the first horizontal bank, the second horizontal bank, the third vertical bank, and the first vertical bank and the third sub-pixel and the sixth sub-pixel are alternately arranged in the first direction and are disposed in a zigzag manner,
wherein a distance between the first vertical bank and the second vertical bank disposed on the first horizontal bank or the second horizontal bank adjacent to the fourth sub-pixel is greater than a distance between the first vertical bank and the second vertical bank defining the fourth sub-pixel.

9. The organic light emitting display device of claim 8, wherein the first vertical bank overlaps the first horizontal bank and the second horizontal bank and has a right protrusion protruding toward the fourth sub-pixel,
wherein the second vertical bank has a left protrusion which protrudes toward the first sub-pixel and overlaps the first horizontal bank and the second horizontal bank,
wherein the third vertical bank has a left protrusion which protrudes toward the second sub-pixel and overlaps the first horizontal bank and the second horizontal bank.

10. The organic light emitting display device of claim 9, wherein the distance between the first vertical bank and the second vertical bank that overlap the first horizontal bank or the second horizontal bank adjacent to the fourth sub-pixel is greater than a distance between the right protrusion of the first vertical bank and the second vertical bank defining the fourth sub-pixel.

11. The organic light emitting display device of claim 10, wherein the distance between the right protrusion of the first vertical bank and the second vertical bank defining the fourth sub-pixel is equal to a distance between the first vertical bank and the left protrusion of the second vertical bank defining the first sub-pixel.

12. The organic light emitting display device of claim 9, wherein a distance between the second vertical bank and the third vertical bank that overlap the first horizontal bank or the second horizontal bank adjacent to the second sub-pixel is equal to a distance between the left protrusion of the second vertical bank and the left protrusion of the third vertical bank.

13. The organic light emitting display device of claim 12, wherein the distance between the left protrusion of the second vertical bank and the left protrusion of the third vertical bank is equal to a distance from the second vertical bank defining the fifth sub-pixel to the third vertical bank.

14. The organic light emitting display device of claim 9, wherein a distance between the third vertical bank and the first vertical bank that overlaps the first horizontal bank or the second horizontal bank adjacent to the third sub-pixel is smaller than a distance from the left protrusion of the third vertical bank to the first vertical bank defining the third sub-pixel.

15. The organic light emitting display device of claim 14, wherein the distance from the left protrusion of the third vertical bank to the first vertical bank defining the third sub-pixel is equal to a distance from the third vertical bank defining the sixth sub-pixel to the right protrusion of the first vertical bank.

16. The organic light emitting display device of claim 1, wherein the first sub-pixel is a sub-pixel having luminous efficiency higher than luminous efficiencies of the second sub-pixel and the third sub-pixel.

17. The organic light emitting display device of claim 16, wherein the first sub-pixel is a red sub-pixel, and each of the second sub-pixel and the third sub-pixel is a green sub-pixel or a blue sub-pixel.

18. The organic light emitting display device of claim 1, wherein an area of each of the first sub-pixel, the second sub-pixel, and the third sub-pixel is formed such that the area of the first sub-pixel is smallest and the area of the third sub-pixel is largest.

19. The organic light emitting display device of claim 1, wherein the organic light emitting layer is formed through inkjet printing or nozzle printing.

\* \* \* \* \*